United States Patent
Han et al.

(10) Patent No.: US 11,587,503 B2
(45) Date of Patent: Feb. 21, 2023

(54) METHOD OF AND DISPLAY CONTROL DEVICE FOR EMULATING OLED DEGRADATION FOR OLED DISPLAY PANEL

(71) Applicant: Novatek Microelectronics Corp., Hsinchu (TW)

(72) Inventors: Qiqiang Han, Shaanxi (CN); JianHua Liang, ShaanXi (CN); YuanJia Du, Shandong (CN)

(73) Assignee: Novatek Microelectronics Corp., Hsinchu (TW)

( * ) Notice: Subject to any disclaimer, the term of this patent is extended or adjusted under 35 U.S.C. 154(b) by 8 days.

(21) Appl. No.: 17/094,811

(22) Filed: Nov. 11, 2020

(65) Prior Publication Data

US 2022/0148499 A1 May 12, 2022

(51) Int. Cl.
*G09G 3/3208* (2016.01)
*H01L 27/32* (2006.01)
*G09G 5/10* (2006.01)

(52) U.S. Cl.
CPC ............. *G09G 3/3208* (2013.01); *G09G 5/10* (2013.01); *H01L 27/32* (2013.01); *G09G 2320/041* (2013.01); *G09G 2320/0666* (2013.01)

(58) Field of Classification Search
CPC ........... G09G 3/3208; G09G 2320/041; G09G 2320/0666; G09G 5/10; H01L 27/32
See application file for complete search history.

(56) References Cited

U.S. PATENT DOCUMENTS

| | | | | |
|---|---|---|---|---|
| 2016/0086540 A1* | 3/2016 | Kim | .................... | G09G 3/3275 345/214 |
| 2016/0103171 A1* | 4/2016 | Tsutsui | .................... | G01K 7/00 257/40 |
| 2018/0075798 A1* | 3/2018 | Nho | .................... | G09G 3/32 |
| 2018/0082631 A1* | 3/2018 | Chang | .................... | G09G 3/20 |
| 2018/0374412 A1* | 12/2018 | Kaneko | .................... | G09F 9/33 |
| 2019/0088199 A1* | 3/2019 | Zhang | .................... | G09G 3/3233 |
| 2019/0088205 A1* | 3/2019 | Zhang | .................... | G09G 3/3233 |
| 2020/0372861 A1* | 11/2020 | Ok | .................... | G09G 3/3233 |

* cited by examiner

*Primary Examiner* — Amare Mengistu
*Assistant Examiner* — Jennifer L Zubajlo
(74) *Attorney, Agent, or Firm* — JCIPRNET

(57) ABSTRACT

A method of and a display control device for emulating OLED degradation for an OLED display panel are proposed, where the OLED display panel includes pixels, and each of the pixels includes subpixels. The method includes the following steps. A current image signal is received. A driving signal level for each of the subpixels is determined based on the current image signal. An actual surface temperature of each of the subpixels is estimated based on the corresponding driving signal level. An accumulated stress of each of the subpixels is computed based on the corresponding driving signal level, the corresponding actual surface temperature, and at least one previous image signal prior to the current image signal. A degradation map that emulates OLED degradation of the OLED display panel is generated based on the accumulated stress of each of the subpixels.

18 Claims, 4 Drawing Sheets

METHOD OF AND DISPLAY CONTROL DEVICE FOR EMULATING OLED DEGRADATION FOR OLED DISPLAY PANEL

TECHNICAL FIELD

The disclosure relates to a method of and a display control device for emulating organic light-emitting diode (OLED) degradation for an OLED display panel.

BACKGROUND

In the fiercely competitive electronic industry, degradation (burn-in) has been a severe problem for OLED displays due to the nature of its organic materials. The construction of a reliable degradation model is a fundamental step to resolve the addressed problem. However, no temperature factor has been taken into account in the previous studies, and it results that the existing models are not adequate to emulate the degradation of actual OLED displays.

SUMMARY OF THE DISCLOSURE

A method of and a display control device for emulating OLED degradation for an OLED display panel are proposed.

According to one of the exemplary embodiments, the OLED display panel includes pixels, and each of the pixels includes subpixels, and the method includes the following steps. A current image signal is received. A driving signal level for each of the subpixels is determined based on the current image signal. An actual surface temperature of each of the subpixels is estimated based on the corresponding driving signal level. An accumulated stress of each of the subpixels is computed based on the corresponding driving signal level, the corresponding actual surface temperature, and at least one previous image signal prior to the current image signal. A degradation map that emulates OLED degradation of the OLED display panel is generated based on the accumulated stress of each of the subpixels.

According to one of the exemplary embodiments, the display control device includes a transmitting circuit, a memory circuit, and a processing circuit. The transmitting circuit is configured to couple to a display driving circuit that is used for driving an OLED display panel, where the OLED display panel includes pixels, and each of the pixels includes subpixels. The memory circuit is configured to store data. The processing circuit is configured to receive a current image signal from an image processing device, determine a driving signal level for each of the subpixels based on the current image signal, estimate an actual surface temperature of each of the subpixels based on the corresponding driving signal level, compute an accumulated stress of each of the subpixels based on the corresponding driving signal level, the corresponding actual surface temperature, and at least one previous image signal prior to the current image signal, and generate a degradation map that emulates OLED degradation of the OLED display panel based on the accumulated stress of each of the subpixels.

In order to make the aforementioned features and advantages of the present disclosure comprehensible, preferred embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the present disclosure and is therefore not meant to be limiting or restrictive in any manner. Also the present disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

Figure 1:
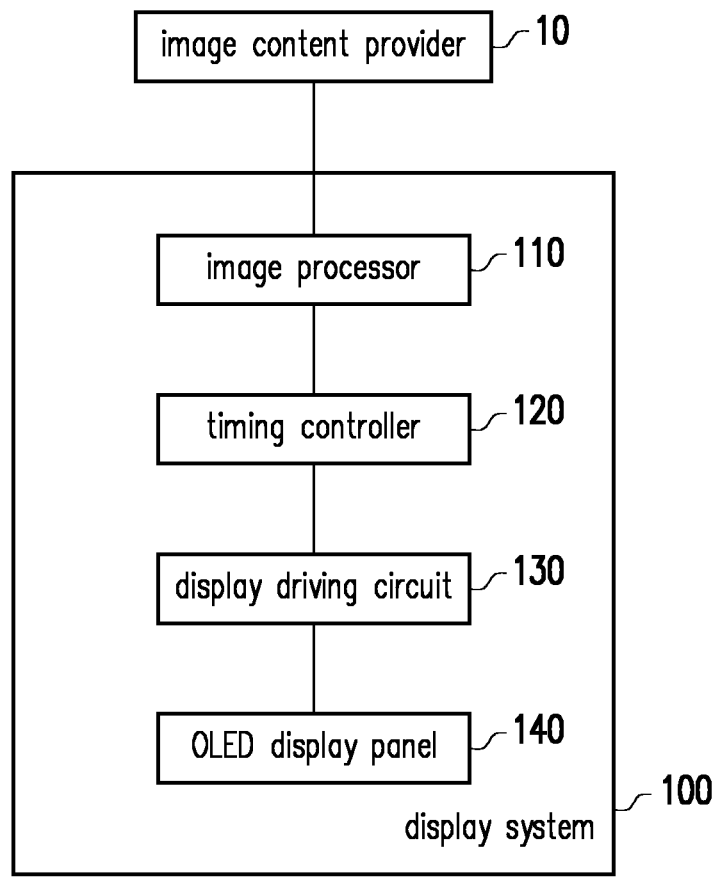
FIG. 1 illustrates a schematic diagram of a display system in accordance with one of the exemplary embodiments of the disclosure.

To make the above features and advantages of the application more comprehensible, several embodiments accompanied with drawings are described in detail as follows.

DESCRIPTION OF THE EMBODIMENTS

Some embodiments of the disclosure will now be described more fully hereinafter with reference to the accompanying drawings, in which some, but not all embodiments of the application are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

FIG. 1 illustrates a schematic diagram of a display system in accordance with one of the exemplary embodiments of the disclosure.

Referring to FIG. 1, a display system 100 would receive images from an image content provider 10 via a wireless or wired communication interface (e.g. a DisplayPort or HDMI connector). The image content provider 10 may be a set-up box, a media player, a television service provider, etc. The display system 100 would include an image processor 110, a timing controller 120, a display driving circuit 130, and an OLED display panel 140. The image processor 110 would be a hardware processor or an integrated circuit to process the received images. The timing controller 120 would be connected to the image processor 110 and the display driving circuit 130 through, for example, an eDP interface and a mini-LVDS interface, and would convert the processed images to image data signals adapted for being displayed on the OLED display pane 140. The display driving circuit 130 would output data voltages based on the received image data signals to drive pixels of the display panel 140. The OLED display panel 140 would include multiple pixels, and each pixel includes multiple subpixels as known per se.

Figure 2:
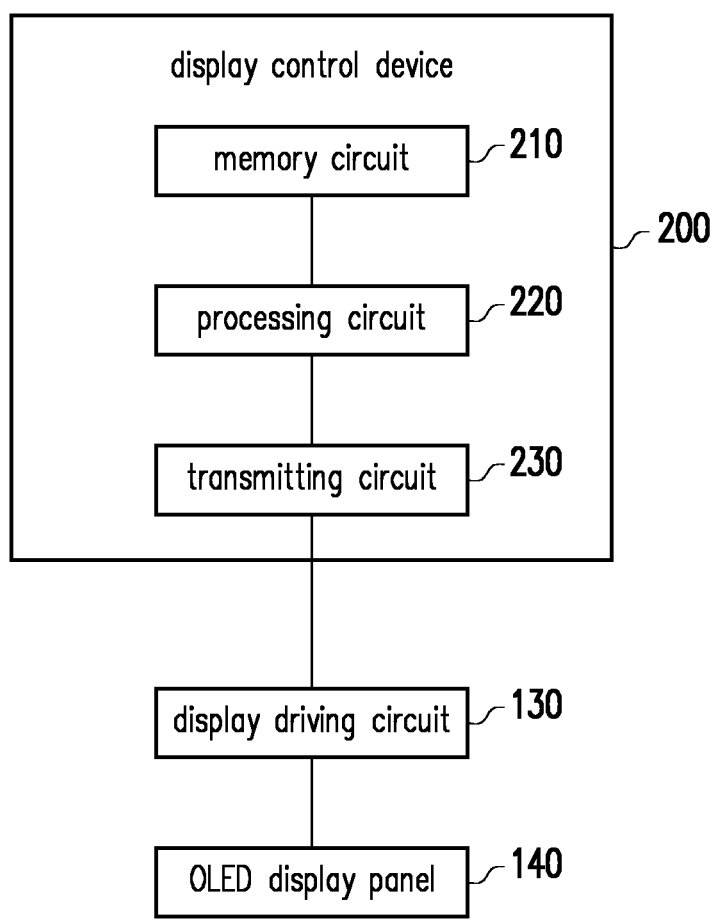
FIG. 2 illustrates a schematic diagram of a proposed display control device in accordance with one of the exemplary embodiments of the disclosure.

FIG. 2 illustrates a schematic diagram of a proposed display control device in accordance with one of the exemplary embodiments of the disclosure. All components of the display control device and their configurations are first introduced in FIG. 2. The functionalities of the components are disclosed in more detail in conjunction with FIG. 3.

Referring to FIG. 2 in conjunction to FIG. 1, a display control device 200 would include a memory circuit 210, a processing circuit 220, and a transmitting circuit 230 in the present exemplary embodiment. The display control device 200 may be as the timing controller 120 and implemented as an integrated circuit (IC). The memory circuit 210 would be configured to store programming codes, device configurations, data, and so forth, in non-volatile memory. The processing circuit 220 would be coupled to the memory circuit 210 and the transmitting circuit 230 and configured to implement functional elements of the proposed method in the following exemplary embodiments. The display driving circuit 130 would output data voltages for driving the OLED display panel 140 based on the image data signal issued by the processing circuit 220 via the transmitting circuit 230.

Figure 3:
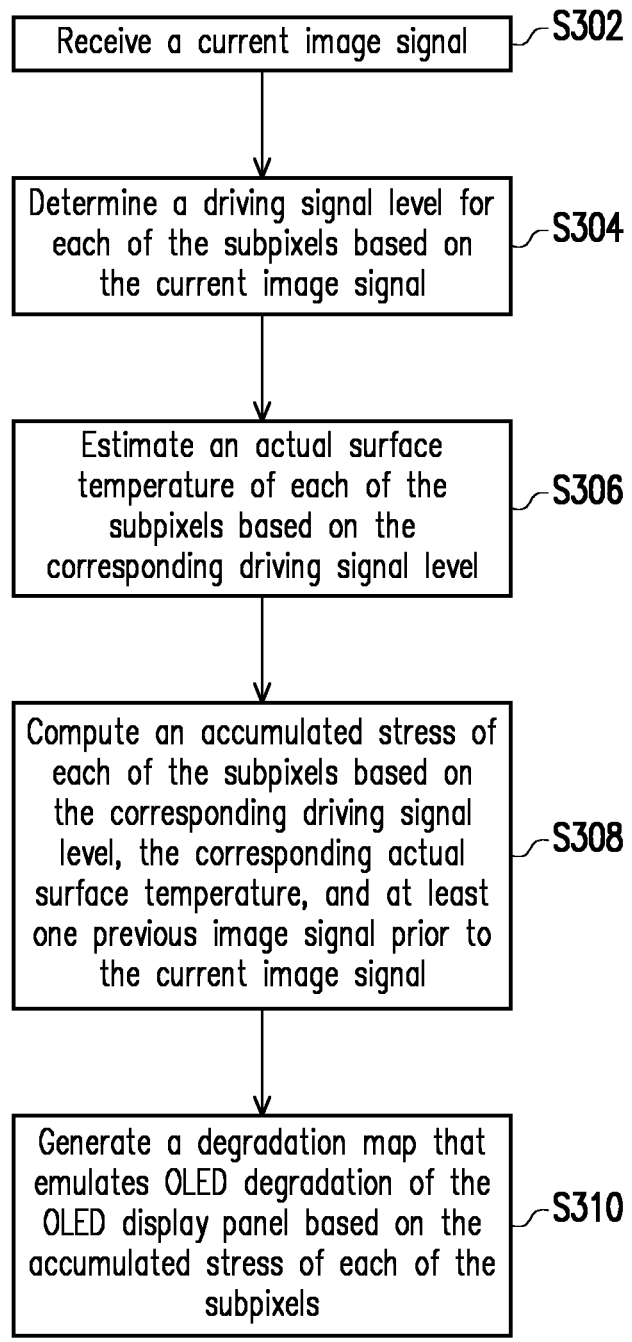
FIG. 3 illustrates a flowchart of a proposed method of emulating OLED degradation for an OLED display panel in accordance with one of the exemplary embodiments of the disclosure.

FIG. 3 illustrates a flowchart of a proposed method of emulating OLED degradation for an OLED display panel in accordance with one of the exemplary embodiments of the disclosure. The steps of FIG. 3 could be implemented by the proposed display control device 200 as illustrated in FIG. 2.

Referring to FIG. 3 in conjunction to FIG. 1 and FIG. 2, the processing circuit 220 of the display control device 200 would receive a current image signal (Step S302) and determine a driving signal level for each of the subpixels based on the current image signal (Step S304). Herein, the processing circuit 220 may calculate a luminous intensity of each of the subpixels based on the received image signal and then determine a driving signal level for each of the subpixels based on the corresponding luminous intensity. Next, the processing circuit 220 would estimate an actual surface temperature of each of the subpixels based on the corresponding driving signal level (Step S306), where the relationship between driving signal levels and surface temperatures may be pre-established and would be provided in detail later on.

Next, the processing circuit 220 would compute an accumulated stress of each of the subpixels based on the corresponding driving signal level, the corresponding actual surface temperature, and at least one previous image signal prior to the current image signal (Step S308) and generate a degradation map that emulates OLED degradation of the OLED display panel based on the accumulated stress of each of the subpixels (Step S310). A driving signal level and an actual surface temperature of each previous image signal may be stored in the memory circuit 210 for the computation of the current accumulated stress of each of the subpixels. It should be understood that the driving signal level and the actual surface temperature corresponding to the current image signal may be stored in the memory circuit 210 for future usage. The processing circuit 220 would adjust image data to be displayed by the subpixels of the OLED display panel 140 according to the degradation map. Since the degradation map is generated based on the accumulated stress of each of the subpixels taking account of the temperature factor, the generated degradation map would be more practical for an actual OLED display panel as opposed to those generated with no temperature factor or with merely ambient temperature taken into account.

Figure 4:
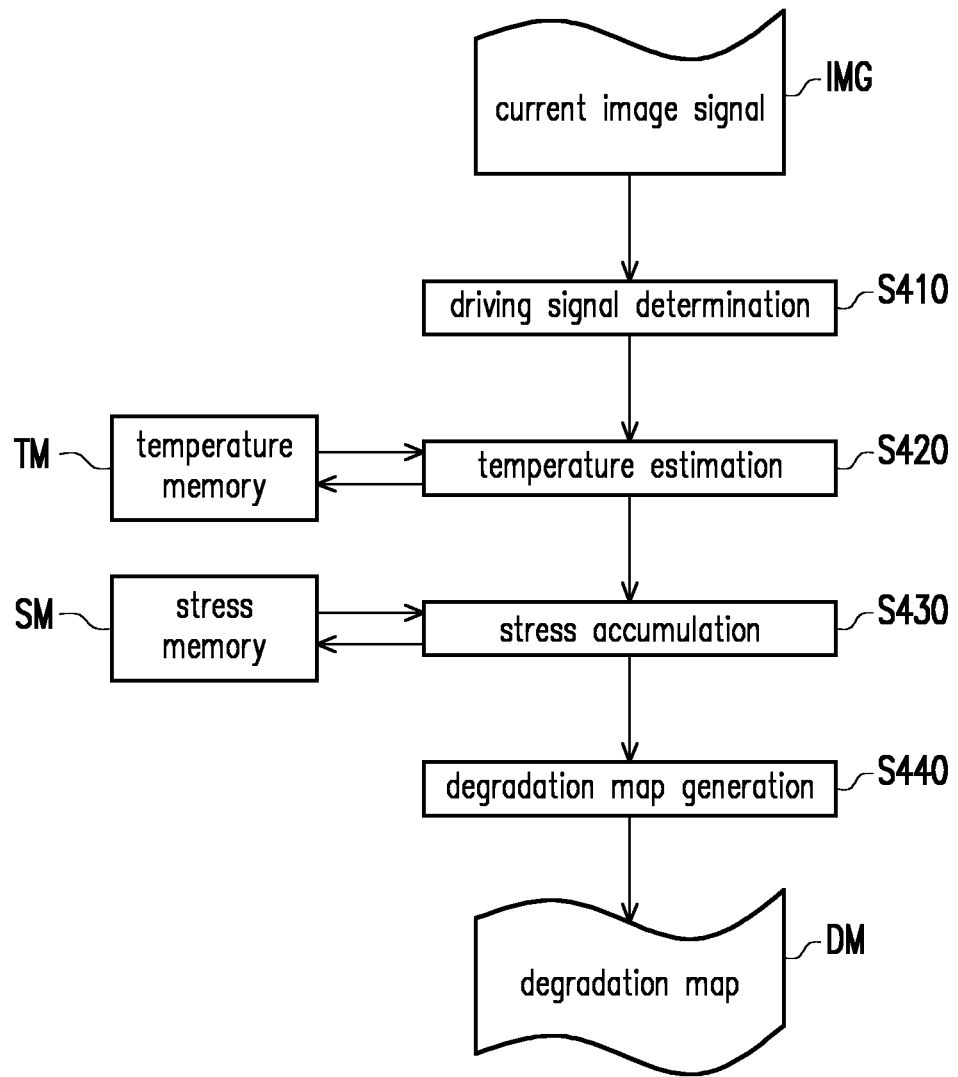
FIG. 4 illustrates a schematic diagram of a proposed method of emulating OLED degradation for an OLED display panel in accordance with another one of the exemplary embodiments of the disclosure.

To be more comprehensible, FIG. 4 illustrates a schematic diagram of a proposed method of emulating OLED degradation for an OLED display panel in accordance with another one of the exemplary embodiments of the disclosure. The steps of FIG. 4 could be implemented by the proposed display control device 200 as illustrated in FIG. 2.

Referring to FIG. 4 in conjunction to FIG. 1 and FIG. 2, the processing circuit 220 of the display control device 200 would receive a current image signal IMG and perform a driving signal determination process S410. Herein, the processing circuit 220 would compute a luminous intensity of each subpixel of the OLED display panel 140 based on the current image signal IMG and determine the driving signal level for each of the subpixels based on the corresponding luminous intensity.

In the present exemplary embodiment, the processing circuit 220 may compute the driving signal level for each of the subpixels based on the current image signal IMG, a gamma value of the OLED display panel 140, and a luminous intensity scaling parameter of a color channel of the subpixel determined based on the corresponding luminous intensity. In terms of the received image signal, there may be red/green/blue (R/G/B) channels or red/green/blue/white (R/G/B/W) channels. The driving signal for the R/G/B subpixel or the R/G/B/W subpixel may be expressed as Eq.(1.1) and Eq.(1.2), $$\begin{cases} DSLR(i,j) = A_R * (Rin(i,j)/RefV)^\gamma \\ DSLG(i,j) = A_G * (Gin(i,j)/RefV)^\gamma \\ DSLB(i,j) = A_B * (Bin(i,j)/RefV)^\gamma \end{cases} \quad \text{Eq.(1.1)}$$

$$\begin{cases} DSLR(i,j) = A_R * (Rin(i,j)/RefV)^\gamma \\ DSLG(i,j) = A_G * (Gin(i,j)/RefV)^\gamma \\ DSLB(i,j) = A_B * (Bin(i,j)/RefV)^\gamma \\ DSLW(i,j) = A_W * (Win(i,j)/RefV)^\gamma \end{cases} \quad \text{Eq.(1.2)}$$

Herein, Rin, Gin, Bin, and Win denote the current image signal in the R, G, B, and W channels respectively. DSLR, DSLG, DSLB, and DSLW denote the driving signal levels for the R, G, B, and W channels respectively. $A_R$, $A_G$, $A_R$, and $A_W$ denote the luminous intensity scaling parameter for the R, G, B, and W channels respectively. (i,j) denotes vertical and horizontal pixel positions. $\gamma$ denotes the gamma value of the OLED display panel 140. RefV denotes a reference normalization value (e.g. 255 for 8-bit data, 1023 for 10-bit data).

Next, the processing circuit 220 would perform a temperature estimation process S420. Herein, the processing circuit 220 would compute a target surface temperature of each of the subpixels based on the corresponding driving signal level and estimate the actual surface temperature of each of the subpixels based on the corresponding target surface temperature, a previous actual surface temperature of each of the subpixels estimated based on a previous image signal prior to the current image signal obtained from a temperature memory TM, and a speed control of an actual surface temperature change between the current image signal and the previous image signal.

In the present exemplary embodiment, the target surface temperature of each of the subpixels may be a polynomial of the corresponding driving signal level as expressed in Eq. (2.1), $$\begin{cases} TR(i,j) = C1R*DSLR(i,j)^2 + C2R*DSLR(i,j) + C3R, & 0 \le DSLR(i,j) \le 1 \\ TG(i,j) = C1G*DSLG(i,j)^2 + C2G*DSLG(i,j) + C3G, & 0 \le DSLG(i,j) \le 1 \\ TB(i,j) = C1B*DSLB(i,j)^2 + C2B*DSLB(i,j) + C3B, & 0 \le DSLB(i,j) \le 1 \\ TW(i,j) = C1W*DSLW(i,j)^2 + C2W*DSLW(i,j) + C3W, & 0 \le DSLW(i,j) \le 1 \end{cases} \quad \text{Eq.(2.1)}$$

Herein DSLR, DSLG, DSLB, and DSLW denote the driving signal levels for the R, G, B, and W channels respectively. C1R, C2R, and C3R denote coefficients for the R channel. C1G, C2G, and C3G denote coefficients for the G channel. C1B, C2B, and C3B denote coefficients for the B channel. C1 W, C2 W, and C3 W denote coefficients for the W channel. TR, TG, TB, and TW denote target surface temperatures of R, G, B, and W channels respectively. (i,j) denotes vertical and horizontal pixel positions.

In the present exemplary embodiment, the actual surface temperature would be estimated based on the target surface temperature with the change of image signals. The actual surface temperature of each of the subpixels may be a weighted sum of the corresponding target surface temperature and the corresponding previous actual surface temperature, and a weight variable of the weighted sum may be associated with the speed control of the actual surface temperature change. Such behavior may be expressed as Eq.(2.2), $$\begin{cases} ATR(i,j) = TR(i,j)*\alpha + ATR\_last(i,j)*(1-\alpha) \\ ATG(i,j) = TG(i,j)*\alpha + ATG\_last(i,j)*(1-\alpha) \\ ATB(i,j) = TB(i,j)*\alpha + ATB\_last(i,j)*(1-\alpha) \\ ATW(i,j) = TW(i,j)*\alpha + ATW\_last(i,j)*(1-\alpha) \end{cases} \quad \text{Eq.(2.2)}$$

Herein TR, TG, TB, and TW denote target surface temperatures of the R, G, B, and W channels respectively. ATR, ATG, ATB, and ATW denote actual surface temperatures of the R, G, B, and W channels respectively. ATR_last, ATG_last, ATB_last, ATW_last denote actual surface temperatures of the R, G, B, W channels of a previous image signal respectively. α denotes the speed control of the actual temperature change. (i,j) denotes vertical and horizontal pixel positions.

In the present exemplary embodiment, after the actual surface temperature is computed, it may be stored in the temperature memory TM for future usage. Also, the processing circuit 220 would compute an acceleration factor of each of the subpixels based on the corresponding actual surface temperature by using an Arrhenius equation as expressed in Eq.(2.3), $$\begin{cases} TAF_R(i,j) = \exp(EA/(k*T_{ref}) - EA/(k*(ATR(i,j)+TAB))) \\ TAF_G(i,j) = \exp(EA/(k*T_{ref}) - EA/(k*(ATG(i,j)+TAB))) \\ TAF_B(i,j) = \exp(EA/(k*T_{ref}) - EA/(k*(ATB(i,j)+TAB))) \\ TAF_W(i,j) = \exp(EA/(k*T_{ref}) - EA/(k*(ATW(i,j)+TAB))) \end{cases} \quad (2\text{-}3)$$

Herein, ATR, ATG, ATB, and ATW denote actual surface temperatures of R, G, B, and W channels respectively. $TAF_R$, $TAF_G$, $TAF_B$, $TAF_W$ denote temperature acceleration factors of R, G, B, and W channels respectively. EA denotes thermal activation energy. k denotes a Boltzmann constant. TAB denotes an absolute reference temperature (Kelvin) of zero degree centigrade. $T_{ref}$ denotes a reference temperature in Kelvin. (i,j) denotes vertical and horizontal pixel positions.

Next, the processing circuit 220 would perform a stress accumulation process S430.

Herein, the processing circuit 220 would compute an accumulated stress of each of the subpixels based on the corresponding driving signal level, the acceleration factor of the corresponding actual surface temperature, and a corresponding accumulated stress of the previous image signal prior to the current image signal obtained from a stress memory SM. In the present exemplary embodiment, the accumulated stress until the current image signal may be expressed as Eq.(3.1), $$\begin{cases} ASR(i,j) = ASR_{last}(i,j) + (DSLR(i,j)*TAF_R(i,j))^{1/m} \\ ASG(i,j) = ASG_{last}(i,j) + (DSLG(i,j)*TAF_G(i,j))^{1/m} \\ ASB(i,j) = ASB_{last}(i,j) + (DSLB(i,j)*TAF_B(i,j))^{1/m} \\ ASW(i,j) = ASW_{last}(i,j) + (DSLW(i,j)*TAF_W(i,j))^{1/m} \end{cases} \quad (3\text{-}1)$$

Herein, ASR, ASG, ASB, and ASW denote the accumulated stresses until the current image signal in the R, G, B, and W channels respectively. $ASR_{last}$, $ASG_{last}$, $ASB_{last}$, and $ASW_{last}$ denote the accumulated stresses until the previous image signal in the R, G, B, and W channels respectively. DSLR, DSLG, DSLB, and DSLW denote the driving signal levels for the R, G, B, and W channels respectively. $TAF_B$, $TAF_G$, $TAF_B$, $TAF_W$ denote temperature acceleration factor of the R, G, B, and W channels respectively. m denotes a model parameter of the acceleration factor. (i,j) denotes vertical and horizontal pixel positions. Once the accumulated stress of the current image signal is computed, it may be stored in the stress memory SM for future usage.

Next, the processing circuit 220 would perform a degradation map generation process S440. Herein, the processing circuit 220 would first compute a degradation level of each of the subpixels based on an initial degradation level of the subpixel, a degradation parameter of a color channel of the subpixel, the corresponding accumulated stress, the model parameter of the corresponding acceleration factor, and an initial degradation level of the subpixel and generate a degradation map DM of the OLED display panel 140 by using the degradation level of each of the subpixels. The processing circuit 220 would adjust image data to be displayed by the subpixels of the OLED display panel according to the degradation map DM. In the present exemplary embodiment, the degradation map DM may be generated based on Eq.(4.1), $$\begin{cases} DRMap(i,j) = A*\exp\left(-K_R*\left(\frac{ASR(i,j)}{frm}\right)^m*frm^m\right) \\ DGMap(i,j) = A*\exp\left(-K_G*\left(\frac{ASG(i,j)}{frm}\right)^m*frm^m\right) \\ DBMap(i,j) = A*\exp\left(-K_B*\left(\frac{ASB(i,j)}{frm}\right)^m*frm^m\right) \\ DWMap(i,j) = A*\exp\left(-K_W*\left(\frac{ASW(i,j)}{frm}\right)^m*frm^m\right) \end{cases} \quad (4\text{-}1)$$

Herein, DRMap, DGMap, DBMap, and DWMap denote the generated degradation map for the R, G, B, and W channels respectively. A denotes the initial degradation level. $K_R$, $K_R$, $K_R$, and $K_R$ denote parameters to differentiate the degradation of R, G, B, and W channels respectively. ASR, ASG, ASB, and ASW denote the accumulated stresses until the current image signal in the R, G, B, and W channels respectively. frm denotes image signals that have been accumulated until the current image signal. m denotes a model parameter of the acceleration factor. (i,j) denotes vertical and horizontal pixel positions.

In view of the aforementioned descriptions, the proposed method and display control device would implement an OLED degradation emulator that would be more practical for OLED displays.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method of emulating OLED degradation for an OLED display panel, wherein the OLED display panel comprises a plurality of pixels, wherein each of the pixels comprises a plurality of subpixels, and wherein the method comprises:
    receiving a current image signal;
    determining a driving signal level for each of the subpixels based on the current image signal;
    estimating an actual surface temperature of each of the subpixels based on the corresponding driving signal level;
    computing an acceleration factor of each of the subpixels of the current image signal based on the corresponding actual surface temperature;
    computing an accumulated stress of each of the subpixels of the current image signal based on a corresponding accumulated stress of each of the subpixels of at least one previous image signal prior to the current image signal and a multiplication of the corresponding driving signal level with the corresponding acceleration factor; and
    generating a degradation map that emulates OLED degradation of the OLED display panel based on the accumulated stress of each of the subpixels.

2. The method according to claim 1, wherein the step of determining a driving signal level for each of the subpixels based on the current image signal comprises:
    computing a luminous intensity of each of the subpixels based on the current image signal; and
    determining the driving signal level for each of the subpixels based on the corresponding luminous intensity.

3. The method according to claim 2, wherein the step of determining the driving signal level for each of the subpixels based on the corresponding luminous intensity comprises:
    computing the driving signal level for each of the subpixels based on the current image signal, a gamma value of the OLED display panel, and a luminous intensity scaling parameter of a color channel of the subpixel determined based on the corresponding luminous intensity.

4. The method according to claim 1, wherein the step of estimating the actual surface temperature of each of the subpixels based on the corresponding driving signal level comprises:
    computing a target surface temperature of each of the subpixels based on the corresponding driving signal level; and
    estimating the actual surface temperature of each of the subpixels based on the corresponding target surface temperature, a previous actual surface temperature of each of the subpixels estimated based on a previous image signal prior to the current image signal, and a speed control of an actual surface temperature change between the current image signal and the previous image signal.

5. The method according to claim 4, wherein the target surface temperature of each of the subpixels is a polynomial of the corresponding driving signal level.

6. The method according to claim 4, wherein the actual surface temperature of each of the subpixels is a weighted sum of the corresponding target surface temperature and the corresponding previous actual surface temperature, and wherein a weight variable of the weighted sum is associated with the speed control of the actual surface temperature change.

7. The method according to claim 1, wherein the step of computing the acceleration factor of each of the subpixels based on the corresponding actual surface temperature comprises:
    computing the acceleration factor of each of the subpixels by using an Arrhenius equation with the corresponding actual surface temperature.

8. The method according to claim 1, wherein the step of generating the degradation map that emulates OLED degradation of the OLED display panel based on the accumulated stress of each of the subpixels comprises:
    computing a degradation level of each of the subpixels based on an initial degradation level of the subpixel, a degradation parameter of a color channel of the subpixel, the corresponding accumulated stress, the model parameter of the corresponding acceleration factor, and an initial degradation level of the subpixel; and generating the degradation map of the OLED display panel by using the degradation level of each of the subpixels.

9. The method according to claim 1, wherein after the step of generating the degradation map that emulates OLED degradation of the OLED display panel based on the accumulated stress of each of the subpixels, the method further comprises:
adjusting image data to be displayed by the subpixels of the OLED display panel according to the degradation map.

10. A display control device comprising:
a transmitting circuit, configured to couple to a display driving circuit that is used for driving an OLED display panel comprising a plurality of pixels, wherein each of the pixels comprises a plurality of subpixels;
a memory circuit, configured to store data;
a processing circuit, configured to:
receive a current image signal from an image processing device;
determine a driving signal level for each of the subpixels based on the current image signal;
estimate an actual surface temperature of each of the subpixels based on the corresponding driving signal level;
compute an acceleration factor of each of the subpixels of the current image signal based on the corresponding actual surface temperature;
compute an accumulated stress of each of the subpixels of the current image signal based on a corresponding accumulated stress of each of the subpixels of at least one previous image signal prior to the current image signal and a multiplication of the corresponding driving signal level with the corresponding acceleration factor; and
generate a degradation map that emulates OLED degradation of the OLED display panel based on the accumulated stress of each of the subpixels.

11. The display control device according to claim 10, wherein the processing circuit computes a luminous intensity of each of the subpixels based on the current image signal and determines the driving signal level for each of the subpixels based on the corresponding luminous intensity.

12. The display control device according to claim 11, wherein the processing circuit computes the driving signal level for each of the subpixels based on the current image signal, a gamma value of the OLED display panel, and a luminous intensity scaling parameter of a color channel of the subpixel determined based on the corresponding luminous intensity.

13. The display control device according to claim 10, wherein the processing circuit computes a target surface temperature of each of the subpixels based on the corresponding driving signal level and estimates the actual surface temperature of each of the subpixels based on the corresponding target surface temperature, a previous actual surface temperature of each of the subpixels estimated based on a previous image signal prior to the current image signal, and a speed control of an actual surface temperature change between the current image signal and the previous image signal.

14. The display control device according to claim 13, wherein the target surface temperature of each of the subpixels is a polynomial of the corresponding driving signal level.

15. The display control device according to claim 13, wherein the actual surface temperature of each of the subpixels is a weighted sum of the corresponding target surface temperature and the corresponding previous actual surface temperature, and wherein a weight variable of the weighted sum is associated with the speed control of the actual surface temperature change.

16. The display control device according to claim 10, wherein the processing circuit computes the acceleration factor of each of the subpixels by using an Arrhenius equation with the corresponding actual surface temperature.

17. The display control device according to claim 10, wherein the processing circuit computes a degradation level of each of the subpixels based on an initial degradation level of the subpixel, a degradation parameter of a color channel of the subpixel, the corresponding accumulated stress, the model parameter of the corresponding acceleration factor, and an initial degradation level of the subpixel and generates the degradation map of the OLED display panel by using the degradation level of each of the subpixels.

18. The display control device according to claim 10, wherein the processing circuit is further configured to:
adjust image data to be displayed by the subpixels of the OLED display panel according to the degradation map.

* * * * *